(12) United States Patent
Kamiyama et al.

(10) Patent No.: US 6,169,296 B1
(45) Date of Patent: Jan. 2, 2001

(54) LIGHT-EMITTING DIODE DEVICE

(75) Inventors: Satoshi Kamiyama, Hyogo; Shigeo Yoshii, Kyoto; Ryoko Miyanaga, Nara; Takashi Nishikawa, Osaka; Tohru Saitoh, Osaka; Yoichi Sasai, Osaka, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/176,906

(22) Filed: Oct. 22, 1998

(30) Foreign Application Priority Data

Oct. 27, 1997 (JP) .................................................. 9-294317

(51) Int. Cl.[7] .................................................. H01L 33/00
(52) U.S. Cl. .................................. 257/94; 257/96; 257/97; 257/99
(58) Field of Search ................................. 257/94, 96, 97, 257/99; 438/46, 47

(56) References Cited

U.S. PATENT DOCUMENTS

| 5,319,219 | * | 6/1994 | Cheng et al. | 257/14 |
| 5,381,024 | | 1/1995 | Valster | 257/97 |
| 5,717,226 | | 2/1998 | Lee et al. | 257/86 |
| 5,739,554 | * | 4/1998 | Edmond et al. | 257/103 |
| 5,744,829 | | 4/1998 | Murasato et al. | 257/94 |
| 6,040,590 | * | 3/2000 | O'Brien et al. | 257/94 |
| 6,057,559 | * | 5/2000 | Cheng et al. | 257/94 |

FOREIGN PATENT DOCUMENTS

| 7-176788 | 7/1995 | (JP) . |
| 9-186360 | 7/1997 | (JP) . |
| 9-266352 | 10/1997 | (JP) . |

* cited by examiner

Primary Examiner—William Mintel
(74) Attorney, Agent, or Firm—Eric J. Robinson; Nixon Peabody LLP (57) ABSTRACT

The light-emitting diode device of the present invention includes an active layer, a p-type contact layer, a Schottky electrode and an ohmic electrode. The active layer is formed over an n-type semiconductor substrate. The contact layer is formed over the active layer. The Schottky electrode is selectively formed on the contact layer and makes Schottky contact with the contact layer. The ohmic electrode is formed to surround the Schottky electrode on the contact layer and to be electrically connected to the Schottky electrode and transmits the light emitted from the active layer.

12 Claims, 6 Drawing Sheets

LIGHT-EMITTING DIODE DEVICE

BACKGROUND OF THE INVENTION

The present invention relates to a light-emitting diode device used in various applications including display device and a method for fabricating the same. More particularly, the present invention relates to a light-emitting diode device for outputting blue or green light at a short wavelength and with high efficiency and a method for fabricating the same.

A light-emitting diode has higher efficiency and consumes lower power than an electric light bulb, and therefore is used widely for a display device. During the past few years, a light-emitting diode device for emitting light at a high luminance and at a long wavelength in the spectrum of red, orange, yellow or the like was already provided. On the other hand, a conventional light-emitting diode device for emitting light at a short wavelength in the spectrum of green or blue had a low luminance. Accordingly, in the past, a light-emitting diode device could not emit blue or green light at a luminance high enough to be applicable to an outdoor display screen (on the order of several candelas).

However, just recently, a light-emitting diode device for emitting green or blue light at a luminance as high as six candelas or two candelas, respectively, was developed by using brand new GaN-based crystals. Now a full-color, high-luminance display using these high-luminance light-emitting diode devices is available everywhere.

Hereinafter, a conventional GaN-based light-emitting diode device including a quantum well active layer made of $In_xGa_{1-x}N$ (in this specification, x is a real number and $0 \leq x \leq 1$) will be generally described.

In the conventional device, if operating current is supplied, then electrons and holes are injected into the quantum well active layer and recombined with each other. As a result, the device emits light at a wavelength approximately corresponding to the band gap energy of $In_xGa_{1-x}N$. If the In mole fraction x in $In_xGa_{1-x}N$ is 0.15, then the device emits light at a peak wavelength of about 450 nm in the blue spectrum. On the other hand, if the In mole fraction x in $In_xGa_{1-x}N$ is 0.26, then the device emits light at a peak wavelength of about 520 nm in the green spectrum.

In the conventional GaN-based light-emitting diode device, however, the larger the In mole fraction x in $In_xGa_{1-x}N$ constituting the quantum well active layer is, the lower the crystallinity thereof is. Essentially, $In_xGa_{1-x}N$ is less likely to be a uniform mixed crystal. Thus, when $In_xGa_{1-x}N$ is used, the resulting external quantum efficiency is as low as about 1 to about 2% even if light reflected by the back surface of a substrate made of sapphire, for example, is included in the light output. Herein, the external quantum efficiency is defined as a ratio of the light emitted out of the device to the power consumed by the device. Accordingly, the wavelength thereof is very difficult to control and the production yield of the light-emitting diode device using such a compound is very low. By contrast, the external quantum efficiency of a light-emitting diode device for emitting red light at a wavelength of about 650 nm is about 20% if the reflected light is included in the light output thereof.

PRIOR ART EXAMPLE 1

Hereinafter, as a first prior art example, a light-emitting diode device for emitting light at a short wavelength by using ZnSe-based Group II–VI compound semiconductors, which are the object of much attention recently, instead of GaN-based Group III–V compound semiconductors, will be described with to reference to FIG. 8.

Figure 8:
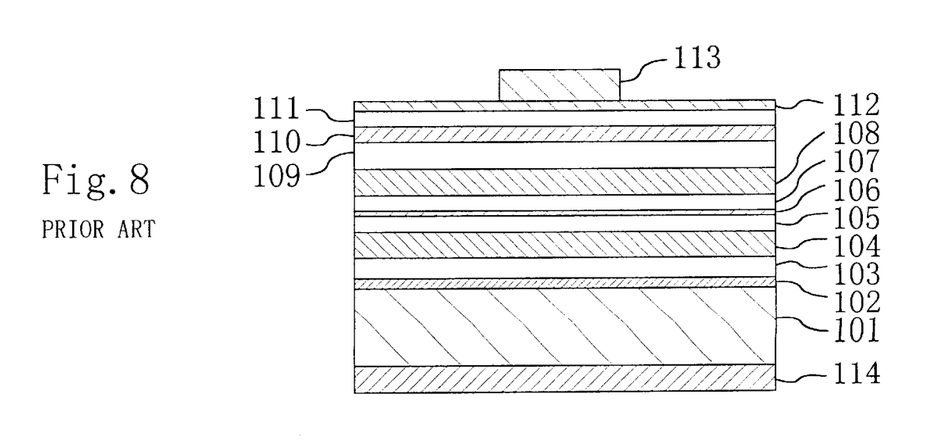
FIG. 8 is a cross-sectional view illustrating the structure of a conventional ZnSe-based light-emitting diode device.

FIG. 8 illustrates the cross-sectional structure of a ZnSe-based light-emitting diode device as the first prior art example. As shown in FIG. 8, a first buffer layer 102, made of n-type GaAs, for buffering lattice mismatching with a substrate 101 made of n-type GaAs is formed on the substrate 101. On the first buffer layer 102, a second buffer layer 103, made of n-type ZnSe, for buffering lattice mismatching between GaAs crystals and ZnSe crystals, is formed. On the second buffer layer 103, a first cladding layer 104, made of n-type ZnMgSSe, for forming a potential barrier for an active layer (to be described below) and thereby efficiently injecting n-type carriers (electrons) into the active layer, is formed. On the first cladding layer 104, a first spacer layer 105, made of non-doped ZnSSe, for improving the crystal quality of the active layer and efficiently injecting the n-type carriers into the active layer, is formed. On the first spacer layer 105, a quantum well active layer 106, made of $Zn_{1-x}Cd_xSe$, for emitting light by the recombination of the injected n-type and p-type minority carriers, is formed. On the quantum well active layer 106, a second spacer layer 107, made of non-doped ZnSSe, for efficiently injecting p-type carriers (holes) into the active layer 106, is formed. On the second spacer layer 107, a second cladding layer 108, made of p-type ZnMgSSe, for forming a potential barrier for the active layer 106 and thereby efficiently injecting p-type carriers into the active layer 106, is formed. On the second cladding layer 108, a semiconductor layer 109, made of p-type ZnSSe, for connecting stepwise the energy level on the valence band between the second cladding layer 108 and a contact layer (to be described below) is formed. On the semiconductor layer 109, a superlattice layer 110, including alternately stacked p-type ZnSe layers and p-type ZnTe layers and connecting stepwise the energy level on the valence band between the semiconductor layer 109 and the contact layer, is formed. And on the superlattice layer 110, a contact layer 111, made of p-type ZnTe, for making ohmic contact with an electrode is formed. These layers 102 through 111 are formed by a molecular beam epitaxy (MBE) technique, for example.

Over the entire upper surface of the contact layer 111, a p-side ohmic electrode 112, made of Pd and Au, is formed. A bonding pad 113, made of Au or the like, is formed in the shape of a dot on the p-side ohmic electrode 112. On the other hand, over the entire lower surface of the substrate 101, an n-side ohmic electrode 114 is formed.

PRIOR ART EXAMPLE 2

Hereinafter, as a second prior art example, a light-emitting diode device for emitting red light at a wavelength in the range from 620 nm to 660 nm by using AlGaInP-based Group III–V compound semiconductors will be described with reference to FIG. 9.

Figure 9:
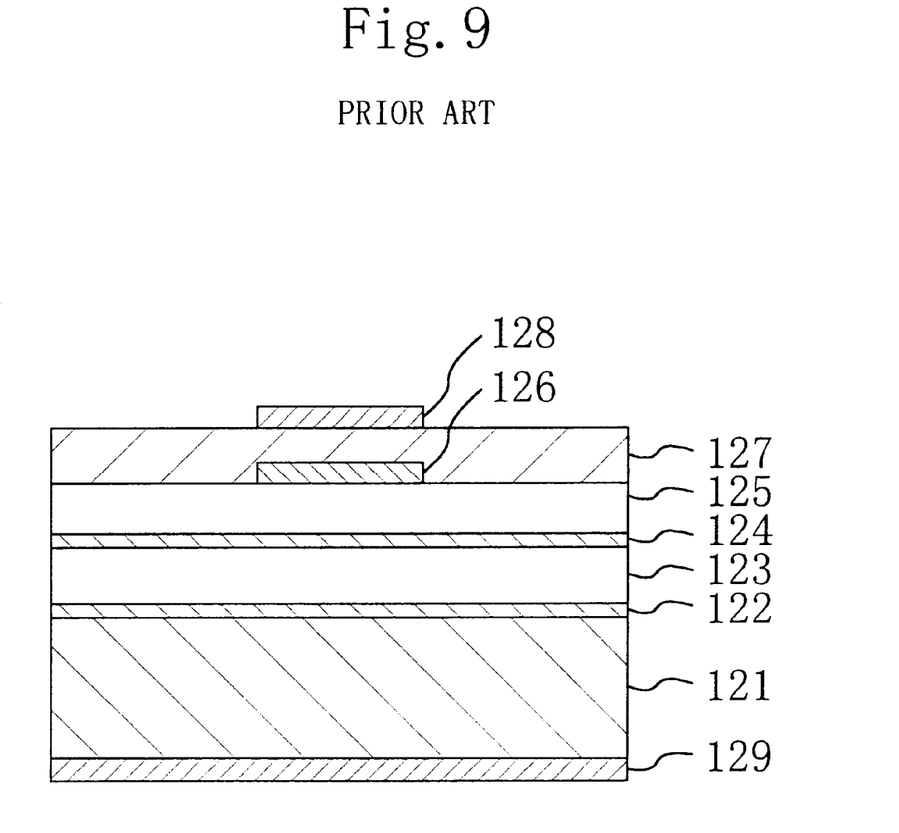
FIG. 9 is a cross-sectional view illustrating the structure of a conventional AlGaInP-based light-emitting diode device.

FIG. 9 illustrates the cross-sectional structure of an AlGaInP-based light-emitting diode device as the second prior art example. As shown in FIG. 9, a buffer layer 122, made of n-type GaInP, for buffering lattice mismatching with a substrate 121 made of n-type GaAs; a first cladding layer 123 made of n-type AlGaInP; an active layer 124 made of non-doped GaInP; a second cladding layer 125 made of p-type AlGaInP; and a current blocking layer 126 made of n-type GaAs are sequentially grown on the substrate 121 by a metalorganic vapor phase epitaxy (MOVPE) technique, for example. Then, the substrate 121 is once taken out of the crystal-growing apparatus. Thereafter, as shown in FIG. 9, the current blocking layer 126 is etched with a part of the layer 126 where a bonding pad is to be formed (hereinafter, simply referred to as a "bonding pad forming region") masked, thereby shaping the current blocking layer 126 like a dot. Next, the substrate 121, on which the current blocking layer 126 has been shaped, is put into the crystal-growing apparatus again. And a current diffusing layer 127, made of p-type AlGaInP, for diffusing and making the current, flowing vertically to the surface of the substrate, flow horizontally to the surface of the substrate, is grown over the entire surfaces of the second cladding layer 125 and the current blocking layer 126. Thereafter, a p-side ohmic electrode 128 in the shape of a dot is formed on the bonding pad forming region of the current diffusing layer 127. On the other hand, an n-side ohmic electrode 129 is formed over the entire lower surface of the substrate 121.

In this device, the current diffusing layer 127 and the current blocking layer 126 forming a pn junction with the layer 127 are formed just under the p-side ohmic electrode 128 functioning as a bonding pad. Accordingly, no current flows just under the p-side ohmic electrode 128, but current flows in the peripheral region of the active layer 124. As a result, the recombination of carriers, generating in a region of the active layer 124 under the p-side ohmic electrode 128, is suppressed, and therefore the emitted light is not absorbed into the p-side ohmic electrode 128. Consequently, a high external quantum efficiency is attained.

As described above, in the second prior art example, the substrate 121 needs to be taken out of the crystal-growing apparatus to form the current blocking layer 126 and then needs to be put into the crystal-growing apparatus again to grow crystals.

However, AlGaInP-based Group III–V semiconductor crystals cause no problem even if the crystal growth is performed discontinuously by taking the substrate out of the crystal-growing apparatus, whereas ZnSe-based Group II–VI compound semiconductors exhibit poor thermal hysteresis by nature. Specifically, if the substrate is put into the crystal-growing apparatus again after the quantum well active layer 106 has been grown as shown in FIG. 8, then a natural oxide film is adversely formed on the crystal-growing surface outside of the apparatus. Thus, in order to remove such a natural oxide film, thermal etching must be performed at a temperature higher than the crystal growing temperature by about 100 degrees centigrade. During a heat treatment for thermal etching, the ZnSe-based quantum well active layer 106 is disadvantageously damaged. Accordingly, the same improvement technique as that applicable to AlGaInP-based crystals cannot be applied to ZnSe-based compound semiconductors.

In addition, if the same substrate is put into a crystal growing apparatus several times, then the productivity is more likely to decrease.

In the first prior art example, by adjusting the mole fraction x in $Zn_{1-x}Cd_xSe$ for the quantum well active layer 106, light can be emitted at a wavelength in the range from 470 nm to 530 nm.

The ZnSe-based light-emitting diode device shows an extremely high internal quantum efficiency (i.e., the ratio of light output inside an active layer to consumed power) of approximately 100%. However, the external quantum efficiency thereof is only about 7%, which is less than half of that of the light-emitting diode device emitting red light.

As can be understood, although the ZnSe-based compound semiconductors have high crystallinity, the light emitted from the active layer 106 cannot be taken out of the device with a satisfactorily high efficiency.

SUMMARY OF THE INVENTION

In order to solve the problem of the first prior art example (i.e., low external quantum efficiency), the present invention was made to increase the external quantum efficiency and productivity of a light-emitting diode device for emitting light at a short wavelength.

To accomplish this object, the present invention selectively forms a Schottky barrier or a high-resistance region just under a pad electrode to be a bonding pad during the formation of a current blocking layer.

A first light-emitting diode device according to the present invention includes: an active layer formed over an n-type semiconductor substrate; a p-type contact layer formed over the active layer; a Schottky electrode, selectively formed on the contact layer, for making Schottky contact with the contact layer, the Schottky electrode being used as a bonding pad; and an ohmic electrode, formed to surround the Schottky electrode on the contact layer and to be electrically connected to the Schottky electrode, for transmitting light emitted from the active layer.

In the first light-emitting diode device, a pad electrode functioning as a Schottky electrode and an ohmic electrode, formed to surround and to be electrically connected to the Schottky electrode, are formed on a contact layer. Accordingly, no current flows just under the Schottky electrode to be a bonding pad, while current flows below and around the Schottky electrode. As a result, since the injection of carriers into a region of the active layer under the Schottky electrode is suppressed, the amount of light emitted from the region of the active layer under the Schottky electrode decreases. On the other hand, since the amount of light radiated from the peripheral region of the active layer below the Schottky electrode increases, the light is less likely to be absorbed into the Schottky electrode. Consequently, the external quantum efficiency increases.

In one embodiment of the present invention, the level of a Schottky barrier between the Schottky electrode and the contact layer is preferably 0.3 eV or more. In such an embodiment, the potential barrier formed by the Schottky electrode can prevent operating current from flowing with more certainty.

In another embodiment of the present invention, the Schottky electrode is preferably made of a conductor selected from a group including aluminum, zinc and thallium. In such an embodiment, the level of the Schottky barrier can be 0.3 eV or more without fail.

A second light-emitting diode device according to the present invention includes: an active layer formed over a semiconductor substrate of a first conductivity type; a contact layer of a second conductivity type formed over the active layer; a pad electrode selectively formed on the contact layer and used as a bonding pad; an ohmic electrode, formed to surround the pad electrode on the contact layer and to be electrically connected to the pad electrode, for transmitting light emitted from the active layer; and a high-resistance region formed under the pad electrode.

In the second light-emitting diode device, a high-resistance region is formed under a pad electrode on a contact layer and an ohmic electrode is formed to surround the pad electrode on the contact layer and to be electrically connected to the pad electrode. Accordingly, no current flows just under the pad electrode to be a bonding pad, while current flows below and around the pad electrode. As a result, since the injection of carriers into a region of the active layer under the pad electrode is suppressed, the amount of light emitted from the region of the active layer under the pad electrode decreases. On the other hand, since the amount of light emitted from the peripheral region of the active layer below the Schottky electrode increases, the external quantum efficiency increases.

In one embodiment of the present invention, the first conductivity type is preferably n-type and the second conductivity type is preferably p-type. And the high-resistance region is preferably made of a p-type semiconductor layer, which is formed between the active layer and the contact layer, is doped with nitrogen atoms at $1\times10^{18}$ cm$^{-3}$ or more and contains zinc and selenium. In such an embodiment, the p-type semiconductor layer is heavily doped with nitrogen atoms functioning as acceptors. Accordingly, the heavily doped region does not fail to have high resistance.

In another embodiment, the high-resistance region is preferably made of an insulating oxide film formed over the active layer. In such an embodiment, since the high-resistance region is thermally stabilized, stable operation can be ensured for the device.

In still another embodiment, the insulating oxide film is preferably made of zinc oxide. In such an embodiment, a device can be formed using Group II–VI compound semiconductors with more certainty. In addition, since zinc oxide itself is a Group II–VI compound, the device is highly stable.

In still another embodiment, the high-resistance region is preferably made of a crystal defect introduced layer formed over the active layer. In such an embodiment, the dopant concentration in the crystal defect introduced layer decreases because the crystal structure of the layer has been damaged. Accordingly, the resistance of such a layer increases without fail.

In still another embodiment, the high-resistance region is preferably formed in the semiconductor substrate. In such an embodiment, a high-resistance region to be a current blocking layer can be formed before a crystal-growing process step is performed, and the crystal-grown layers are not affected by the formation of the high-resistance region. As a result, stable operation can be ensured for the device.

In still another embodiment, the first and second light-emitting diode devices preferably further include a reflective layer, which is formed between the semiconductor substrate and the active layer and has a distributed Bragg-reflector structure. In such an embodiment, the light emitted from the active layer toward the substrate located below the active layer can be reflected by the reflective layer and then taken out from over the active layer. As a result, the external quantum efficiency can be further increased.

A third light-emitting diode device according to the present invention includes: a reflective layer, which is formed over a semiconductor substrate of a first conductivity type and has a distributed Bragg-reflector structure; an active layer formed over the reflective layer; a contact layer of a second conductivity type formed over the active layer; a pad electrode selectively formed on the contact layer and used as a bonding pad; and an ohmic electrode, formed to surround the pad electrode on the contact layer and to be electrically connected to the pad electrode, for transmitting light emitted from the active layer.

In the third light-emitting diode device, since a reflective layer having a distributed Bragg-reflector structure is formed over a semiconductor substrate of a first conductivity type, the light emitted from the active layer downward to the semiconductor substrate is reflected toward the contact layer. Accordingly, the light emitted toward the semiconductor substrate can be taken out of the device from over the contact layer. As a result, the external quantum efficiency can be increased.

A first method for fabricating a light-emitting diode device according to the present invention includes the steps of: forming an active layer containing zinc and selenium over an n-type semiconductor substrate; forming a p-type first contact layer and a p-type second contact layer in this order over the active layer, the second contact layer being implanted with nitrogen atoms to have a dopant concentration as high as $1\times10^{18}$ cm$^{-3}$ or more; depositing a conductor film over the second contact layer and then etching the conductor film and the second contact layer with a bonding pad forming region of the conductor film masked, thereby forming a pad electrode out of the conductor film in the shape of an island and shaping the second contact layer like an island; forming an ohmic electrode to surround the pad electrode over the first contact layer and to make electrical contact with the pad electrode, the ohmic electrode transmitting light emitted from the active layer; and annealing the semiconductor substrate to selectively diffuse the nitrogen atoms from the island-shaped second contact layer toward a region closer to the semiconductor substrate, thereby forming a high-resistance region under the pad electrode and between the island-shaped second contact layer and the active layer.

In the first method, if a semiconductor layer located under the island-shaped second contact layer is a compound semiconductor layer containing Zn and Se, then a region of the compound semiconductor layer under the pad electrode becomes a high-resistance region. That is to say, since the high-resistance region is formed under the pad electrode and an ohmic electrode is formed to surround the pad electrode on the contact layer, no current flows just under the pad electrode but current does flow through a peripheral region below the pad electrode. As a result, since the injection of carriers into a region of the active layer under the pad electrode is suppressed, the amount of light emitted from the region of the active layer under the pad electrode decreases. On the other hand, since the amount of light emitted from the peripheral region of the active layer below the pad electrode increases, the external quantum efficiency increases. In addition, since the crystal-growing process step is continuously performed without any interruption until the second contact layer is formed, the active layer is not thermally damaged. Moreover, as compared with repeatedly performing the crystal-growing process step several times, the productivity can be increased.

A second method for fabricating a light-emitting diode device according to the present invention includes the steps of: forming an active layer containing zinc and selenium over a semiconductor substrate of a first conductivity type; forming a contact layer of a second conductivity type out of a compound semiconductor containing zinc over the active layer; exposing a bonding pad forming region of the contact layer to oxygen plasma produced from oxygen atoms, thereby forming an insulating oxide film made of zinc oxide in the bonding pad forming region, zinc oxide resulting from the oxidation of zinc in the contact layer; depositing a conductor film over the contact layer and the insulating oxide film and then etching the conductor film with a bonding pad forming region of the conductor film masked, thereby forming a pad electrode out of the conductor film in the shape of an island; and forming an ohmic electrode to surround the pad electrode on the contact layer and to make electrical contact with the pad electrode, the ohmic electrode transmitting light emitted from the active layer.

In the second method, an insulating region is formed under a pad electrode and an ohmic electrode is formed to surround the pad electrode on the contact layer. Accordingly, no current flows just under the pad electrode but current does flow through a peripheral region below the pad electrode. As a result, since the amount of light emitted from the region of the active layer under the pad electrode decreases and the amount of light emitted from the peripheral region of the active layer below the pad electrode increases, the external quantum efficiency increases. In addition, since the insulating oxide film to be a current blocking layer can be formed by a plasma oxidation technique at a relatively low temperature, the crystal-grown layers are not thermally damaged. Moreover, since the crystal-growing process step is continuously performed without any interruption until the contact layer is formed, the active layer is not thermally damaged. Furthermore, the productivity can also be increased.

A third method for fabricating a light-emitting diode device according to the present invention includes the steps of: forming an active layer over a semiconductor substrate of a first conductivity type; forming a contact layer of a second conductivity type over the active layer; exposing a bonding pad forming region of the contact layer to plasma produced from an inert gas, thereby forming a crystal defect introduced layer, containing crystal defects, in the bonding pad forming region; depositing a conductor film over the contact layer and the crystal defect introduced layer and then etching the conductor film with a bonding pad forming region of the conductor film masked, thereby forming a pad electrode out of the conductor film in the shape of an island; and forming an ohmic electrode to surround the pad electrode on the contact layer and to make electrical contact with the pad electrode, the ohmic electrode transmitting light emitted from the active layer.

In the third method, a high-resistance region is formed out of a crystal defect introduced layer, containing crystal defects, in a bonding pad forming region, and an ohmic electrode is formed to surround the pad electrode on the contact layer. Accordingly, no current flows just under the pad electrode but current does flow through a peripheral region below the pad electrode. As a result, since the amount of light emitted from the region of the active layer under the pad electrode decreases and the amount of light emitted from the peripheral region of the active layer below the pad electrode increases, the external quantum efficiency increases. In addition, since the crystal defect introduced layer to be a current blocking layer can be formed by using plasma produced from an inert gas, doping using the plasma can be performed at a relatively low temperature and the crystal-grown layers are not thermally damaged. Moreover, since the crystal-growing process step is continuously performed without any interruption until the contact layer is formed, the active layer is not thermally damaged. Furthermore, the productivity can also be increased.

A fourth method for fabricating a light-emitting diode device according to the present invention includes the steps of: implanting hydrogen, boron or oxygen ions into a bonding pad forming region on a semiconductor substrate of a first conductivity type, thereby forming a high-resistance region in the bonding pad forming region; forming an active layer over the semiconductor substrate; forming a contact layer of a second conductivity type over the active layer; depositing a conductor film over the contact layer and then etching the conductor film with a bonding pad forming region of the conductor film masked, thereby forming a pad electrode out of the conductor film in the shape of an island; and forming an ohmic electrode to surround the pad electrode on the contact layer and to make electrical contact with the pad electrode, the ohmic electrode transmitting light emitted from the active layer.

In the fourth method, a high-resistance region is formed by implanting ions into a bonding pad forming region, and an ohmic electrode is formed to surround the pad electrode on the contact layer. Accordingly, no current flows just under the pad electrode but current does flow through a peripheral region below the pad electrode. As a result, since the amount of light emitted from the region of the active layer under the pad electrode decreases and the amount of light emitted from the peripheral region of the active layer below the pad electrode increases, the external quantum efficiency increases. In addition, since the high-resistance region to be a current blocking layer can be formed only in the substrate, the crystal-grown layers are not adversely affected in any way. Moreover, since the crystal-growing process step is continuously performed without any interruption, the productivity can also be increased.

DESCRIPTION OF THE PREFERRED EMBODIMENTS

The present inventors carried out intensive research on the reason why the external quantum efficiency of a light-emitting diode device for emitting light at a short wavelength by using ZnSe-based Group II–VI compound semiconductors having excellent crystallinity and high internal quantum efficiency is low. As a result, we arrived at the following conclusion.

The prime reason is that almost all the light emitted from a region of the quantum well active layer 106 (see FIG. 8) just under the bonding pad 113 is absorbed into the bonding pad 113 and cannot be taken out of the device. Although the p-side ohmic electrode 112 transmitting the emitted light is formed over the entire surface of the contact layer 111, the thickness of the ohmic electrode 112 is as small as about several tens nanometers to transmit the light emitted from inside the device. Accordingly, the sheet resistance of the electrode 112 is high and current is less likely to diffuse. As a result, the most part of light emission is generated in a region of the active layer 106 just under the bonding pad 113 and the vicinity thereof. The loss of the emitted light by the bonding pad 113 is also true of the GaAs-based light-emitting diode device.

The second reason is that the substrate 101 absorbs the emitted light. The light produced from the quantum well active layer 106 is emitted toward both the upper and lower surfaces of the substrate 101 equally. The light emitted toward the upper surface of the substrate 101 can be taken out, whereas the light emitted toward the lower surface thereof is absorbed into the substrate 101 and cannot be used. In a GaN-based light-emitting diode device, however, a sapphire substrate transmitting the emitted light is ordinarily used. Accordingly, there is not such a problem as for the GaAs-based device.

Based on this conclusion, in forming a current blocking layer, crystal-grown layers are continuously formed over a substrate during a single process step and then a Schottky barrier or a high-resistance region is selectively formed just under a pad electrode to be a bonding pad.

Embodiment 1

Hereinafter, the first embodiment of the present invention will be described with reference to FIG. 1.

Figure 1:
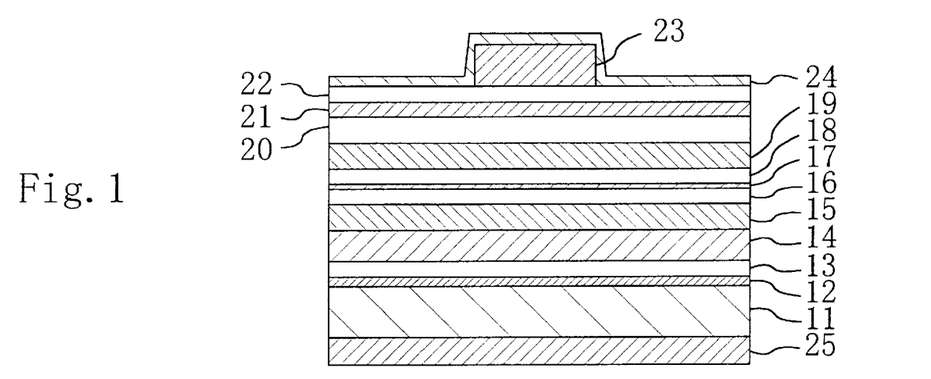
FIG. 1 is a cross-sectional view illustrating the structure of a ZnSe-based light-emitting diode device in the first embodiment of the present invention.

FIG. 1 illustrates the cross-sectional structure of a ZnSe-based light-emitting diode device in the first embodiment of the present invention. As shown in FIG. 1, a first buffer layer 12, made of n-type GaAs, for buffering lattice mismatching with a substrate 11 made of n-type GaAs is formed on the substrate 11. On the first buffer layer 12, a second buffer layer 13, made of n-type ZnSe, for buffering lattice mismatching between GaAs crystals and ZnSe crystals, is formed. On the second buffer layer 13, a reflective layer 14, having a distributed Bragg-reflector (DBR) structure formed by alternately stacking n-type ZnSSe and n-type ZnMgSSe layers, is formed. On the reflective layer 14, a first cladding layer 15, made of n-type ZnMgSSe, for forming a potential barrier for an active layer (to be described below) and thereby efficiently injecting n-type carriers into the active layer, is formed. On the first cladding layer 15, a first spacer layer 16, made of non-doped ZnSSe, for improving the crystal quality of the active layer and efficiently injecting the n-type carriers into the active layer, is formed. On the first spacer layer 16, a quantum well active layer 17, made of $Zn_{1-x}Cd_xSe$, for emitting light by the recombination of the injected n-type and p-type minority carriers, is formed. On the quantum well active layer 17, a second spacer layer 18, made of non-doped ZnSSe, for efficiently injecting p-type carriers into the active layer, is formed. On the second spacer layer 18, a second cladding layer 19, made of p-type ZnMgSSe, for forming a potential barrier for the active layer 17 and thereby efficiently injecting p-type carriers into the active layer 17, is formed. On the second cladding layer 19, a semiconductor layer 20, made of p-type ZnSSe, for connecting stepwise the energy level on the valence band between the second cladding layer 19 and a contact layer (to be described below) is formed. On the semiconductor layer 20, a superlattice layer 21, including alternately stacked p-type ZnSe layers and p-type ZnTe layers and connecting stepwise the energy level on the valence band between the semiconductor layer 20 and the contact layer, is formed. On the superlattice layer 21, a contact layer 22, made of p-type ZnTe, for making ohmic contact with an electrode is formed.

The respective layers of the reflective layer 14 are in lattice matching with the substrate 11, and the lattice constants thereof are set at one-quarter of the effective light emission wavelength. For example, in using an n-type ZnMgSSe crystal having band gap energy of 2.85 eV, if the reflective layer 14 has 20 periods, then a reflectivity of about 70% is attained. The reflectivity may be further increased by increasing the band gap energy or the number of periods.

On the upper surface of the contact layer 22, a Schottky electrode 23, which is made of Al and has a thickness of several hundreds nanometers, is formed in the shape of a dot (or an island) to be a bonding pad. Since the Schottky electrode 23 is made of Al, the electrode 23 can form a Schottky barrier (or a potential barrier) having a relatively large level of 0.3 eV or more for the contact layer 22 made of p-type ZnTe. A p-side ohmic electrode 24, which is made of Pd and Au and has such a thickness as to transmit the emitted light (e.g., 50 nm or less), is formed over the entire surface of the contact layer 22, as well as over the Schottky electrode 23. On the other surface of the substrate 11 opposite to the crystal-growing surface thereof, an n-side ohmic electrode 25 made of Ni/AuGe/Au is formed.

Hereinafter, the operation of the light-emitting diode device having the above-described structure will be described.

The n-side ohmic electrode 25 is grounded and a predetermined operating voltage is applied to the p-side ohmic electrode 24 such that the device is forward biased. Then, holes and electrons are injected into the quantum well active layer 17 from the p-type semiconductor layers and the n-type semiconductor layers, respectively. As a result, the energy generated during the recombination of these carriers is emitted as light from the quantum well active layer 17.

In this embodiment, the Schottky electrode 23 has a thickness as large as several hundreds nanometers, and therefore functions as a pad for bonding a wire made of Au or the like thereto. However, since the Schottky electrode 23 is in Schottky contact with the contact layer 22 and has a high contact resistance, the Schottky electrode 23 is not an ohmic electrode used for an ordinary light-emitting diode. Also, the p-side ohmic electrode 24 is formed to have such a thickness (i.e., 50 nm or less) as to transmit the emitted light resulting from the recombination of electrons and holes in the quantum well active layer 17.

Accordingly, substantially no hole current is injected into a region of the quantum well active layer 17 under the Schottky electrode 23. Instead, current is injected from the p-side ohmic electrode 24. As a result, light is emitted from a peripheral region of the quantum well active layer 17 below the Schottky electrode 23. Consequently, the emitted light is not absorbed into the Schottky electrode 23 and can be efficiently taken out of the device through the upper surface thereof.

Moreover, since the reflective layer 14 having a DBR structure is formed between the substrate 11 and the quantum well active layer 17, almost all the light emitted from the quantum well active layer 17 toward the substrate 11 is reflected by the reflective layer 14. As a result, most of the emitted light can be taken out through the upper part of the device. Consequently, the efficiency can be further increased.

In this embodiment, the Schottky electrode 23 having a Schottky barrier is used as a pad electrode to be a bonding pad. The reflective layer 14 is provided for reflecting the emitted light, which would otherwise be absorbed into the substrate 11, and for taking the light out through the upper part of the substrate 11. As a result, an external quantum efficiency of 20% or more can be ultimately attained easily and with more certainty at a wavelength of about 500 nm without performing the same crystal-growing process step several times.

The Schottky electrode is made of Al in this embodiment. Alternatively, Zn or Tl, enabling a Schottky barrier of 0.3 eV or more, may be used instead.

Modified Example of Embodiment 1

Hereinafter, a modified example of the first embodiment will be described with reference to FIG. 2.

Figure 2:
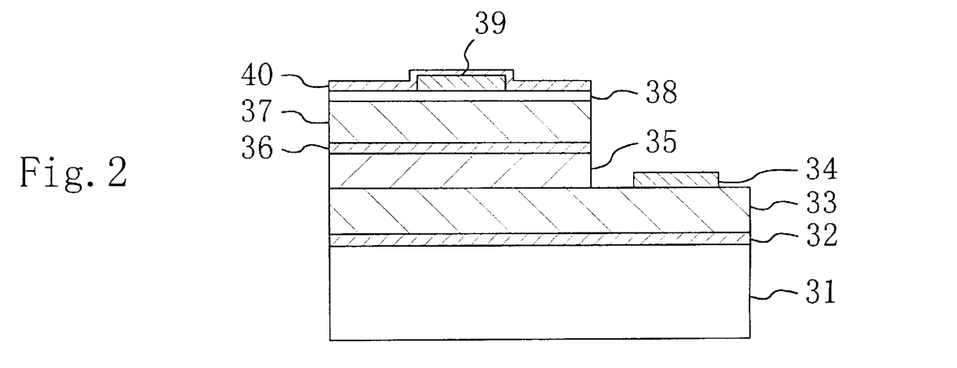
FIG. 2 is a cross-sectional view illustrating the structure of a GaAs-based light-emitting diode device in a modified example of the first embodiment.

FIG. 2 illustrates the cross-sectional structure of a GaN-based light-emitting diode device as a modified example of the first embodiment. As shown in FIG. 2, on a substrate 31 made of sapphire having a plane orientation (0001), a buffer layer 32, made of AlN, for buffering lattice mismatching between sapphire crystals and GaN crystals is formed. On the buffer layer 32, a semiconductor layer 33, made of n-type GaN, for securing a current path is formed. On a part of the upper surface of the semiconductor layer 33, light-emitting device portion is formed. On the other part of the upper surface, an electrode portion is formed. In the electrode portion of the semiconductor layer 33, an n-side ohmic electrode 34 made of Ti/Al is formed. In the light-emitting device portion, a first cladding layer 35, made of n-type AlGaN, for forming a potential barrier for an active layer and thereby efficiently injecting electrons into the active layer, is formed. On the first cladding layer 35, a quantum well active layer 36, made of InGaN, for emitting light by the recombination of the injected electrons and holes, is formed. On the quantum well active layer 36, a second cladding layer 37 for forming a potential barrier for the active layer 36 and thereby efficiently injecting holes into the active layer 36, is formed. On the second cladding layer 37, a contact layer 38, made of p-type GaN and making electrical contact with an electrode, is formed. On the upper surface of the contact layer 38, a Schottky electrode 39, which is made of Al and has a thickness of several hundreds nanometers, is formed in the shape of a dot (or an island) to be a bonding pad. Since the Schottky electrode 39 is made of Al, the electrode 39 can form a Schottky barrier (or a potential barrier) of 0.3 eV or more for the contact layer 38 made of p-type GaN. A p-side ohmic electrode 40, which is made of Ni/Au and has such a thickness as to transmit the emitted light (e.g., 50 nm or less), is formed over the entire surfaces of the contact layer 38, as well as over the Schottky electrode 39.

In this modified example, the Schottky electrode 39 having a potential barrier of 0.3 eV or more is used as a pad electrode to be a bonding pad and is in contact with the contact layer 38. And the p-side ohmic electrode 40 is formed over the entire surfaces of the contact layer 38, as well as over the Schottky electrode 39. Accordingly, substantially no hole current is injected into a region of the quantum well active layer 36 under the Schottky electrode 23. Instead, current is injected from the p-side ohmic electrode 24 formed around the Schottky electrode 39. As a result, light is emitted from a peripheral region of the quantum well active layer 36 below the Schottky electrode 39. Consequently, the emitted light is not absorbed into the Schottky electrode 39 and can be efficiently taken out of the device through the upper surface thereof.

As described above, this device uses sapphire for the substrate 31. Accordingly, the light emitted from the quantum well active layer 36 toward the substrate 31 is refracted by an end face of the sapphire substrate 31 because the refractive indices of sapphire and the air are different from each other. Then, the light is reflected toward the p-side ohmic electrode 40. Therefore, in this modified example, there is no need to provide any reflective layer.

Embodiment 2

Hereinafter, the second embodiment of the present invention will be described with reference to FIG. 3.

Figure 3:
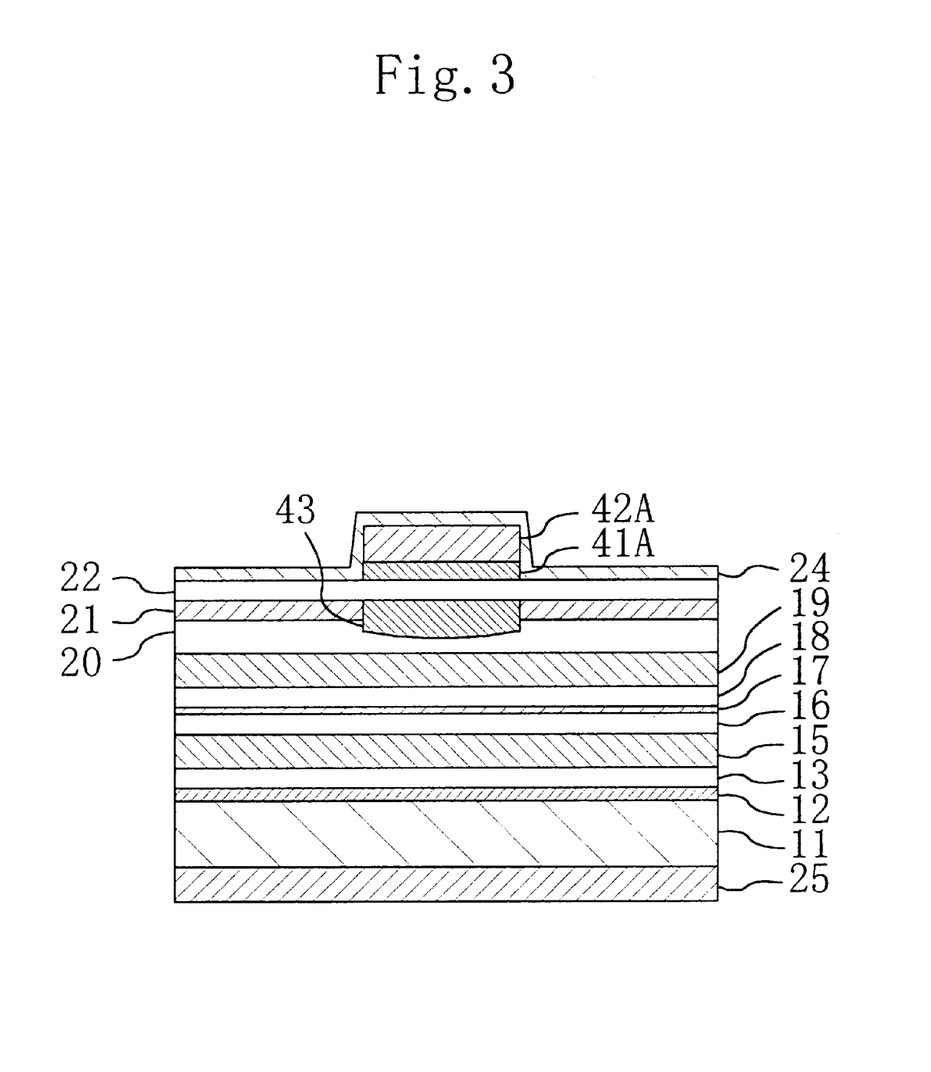
FIG. 3 is a cross-sectional view illustrating the structure of a ZnSe-based light-emitting diode device in the second embodiment of the present invention.

FIG. 3 illustrates the cross-sectional structure of a ZnSe-based light-emitting diode device of the second embodiment. As shown in FIG. 3, a first buffer layer 12, made of n-type GaAs, for buffering lattice mismatching with a substrate 11 made of n-type GaAs is formed on the substrate 11. On the first buffer layer 12, a second buffer layer 13, made of n-type ZnSe, for buffering lattice mismatching between GaAs crystals and ZnSe crystals, is formed. On the second buffer layer 13, a first cladding layer 15, made of n-type ZnMgSSe, for forming a potential barrier for an active layer (to be described below) and thereby efficiently injecting n-type carriers into the active layer, is formed. On the first cladding layer 15, a first spacer layer 16, made of non-doped ZnSSe, for improving the crystal quality of the active layer and efficiently injecting the n-type carriers into the active layer, is formed. On the first spacer layer 16, a quantum well active layer 17, made of $Zn_{1-x}Cd_xSe$, for emitting light by the recombination of the injected n-type and p-type minority carriers, is formed. On the quantum well active layer 17, a second spacer layer 18, made of non-doped ZnSSe, for efficiently injecting p-type carriers into the active layer, is formed. On the second spacer layer 18, a second cladding layer 19, made of p-type ZnMgSSe, for forming a potential barrier for the active layer 17 and thereby efficiently injecting p-type carriers into the active layer 17, is formed. On the second cladding layer 19, a semiconductor layer 20, made of p-type ZnSSe, for connecting stepwise the energy level on the valence band between the second cladding layer 19 and a first contact layer is formed. On the semiconductor layer 20, a superlattice layer 21, including alternately stacked p-type ZnSe layers and p-type ZnTe layers and connecting stepwise the energy level on the valence band between the semiconductor layer 20 and the first contact layer, is formed. On the superlattice layer 21, a first contact layer 22, which is made of p-type ZnTe doped with N atoms such that the concentration of the dopant to be holes is $5 \times 10^{18}$ cm$^{-3}$ or less and makes ohmic contact with an electrode, is formed. And on the first contact layer 22, a second contact layer 41A, which is made of p-type ZnTe doped with N atoms such that the concentration of the dopant to be holes is $5 \times 10^{18}$ cm$^{-3}$ or less and has the same shape as that of a pad electrode in the axial direction, is formed.

On the upper surface of the second contact layer 41A, a pad electrode 42A, which is made of Au (enabling ohmic contact with the second contact layer 41A) and has a thickness of several hundreds nanometers, is formed in the shape of a dot to be a bonding pad. A p-side ohmic electrode 24, which is made of Pd and Au and has such a thickness as to transmit the emitted light (e.g., 50 nm or less), is formed over the entire surface of the first contact layer 22, as well as over the pad electrode 42A. On the other surface of the substrate 11 opposite to the crystal-growing surface, an n-side ohmic electrode 25 made of Ni/AuGe/Au is formed.

This embodiment is characterized in that a high-resistance region 43 is further formed as a current blocking layer under the pad electrode 42A in a part of the superlattice layer 21 and in an upper part of the semiconductor layer 20. The high-resistance region 43 is formed as a result of the diffusion of N atoms from the second contact layer 41A at a concentration as high as $1 \times 10^{18}$ cm$^{-3}$ or more.

Next, a method for fabricating the light-emitting diode device (the high-resistance region 43, in particular) of this embodiment will be described with reference to FIGS. 4(a) through 4(c). In this embodiment, N atoms and Cl atoms are used as p-type and n-type dopants, respectively, for ZnSe-based compound semiconductor layers.

Figure 4A:
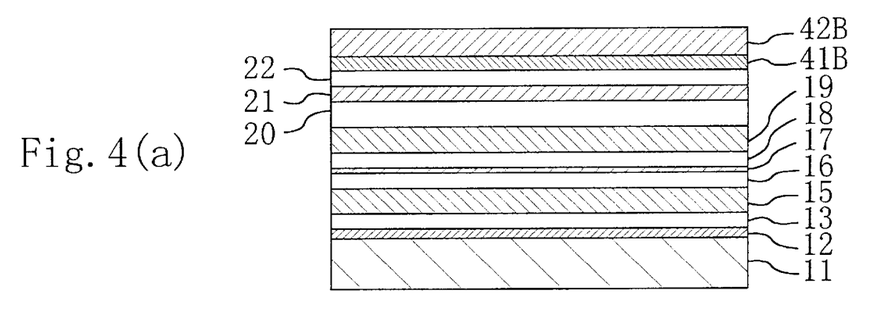
FIGS. 4(a) through 4(c) are cross-sectional views illustrating respective process steps for fabricating the ZnSe-based light-emitting diode device of the second embodiment.

First, as shown in FIG. 4(a), the respective layers from the first buffer layer 12 through a layer 41B to be the second contact layer 41A (second contact forming layer) are sequentially crystal-grown on the substrate 11 in accordance with an MBE technique, for example. Then, a conductor film 42B made of Au is deposited over the entire surface of the second contact forming layer 41B in accordance with a vacuum evaporation technique, for example.

Figure 4B:
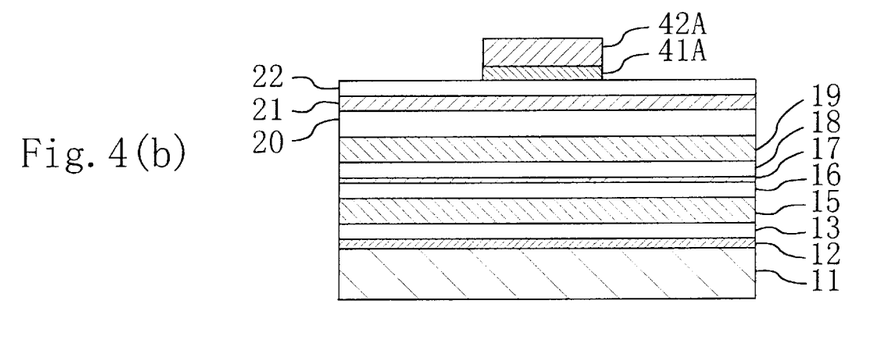

Next, as shown in FIG. 4(b), with a bonding pad forming region of the conductor film 42B masked, the conductor film 42B and the second contact forming layer 41B are etched until the first contact layer 22 is exposed. In this manner, the pad electrode 42A is formed in the shape of a dot and the second contact layer 41A is formed to have the same width as that of the pad electrode 42A.

Figure 4C:
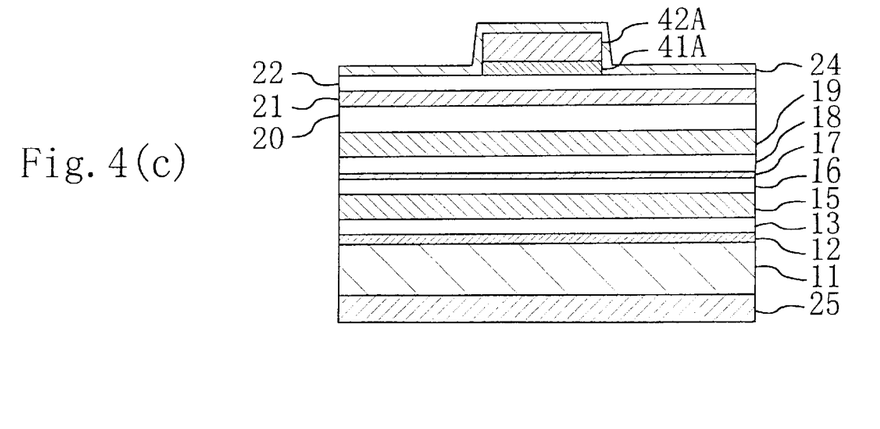

Subsequently, as shown in FIG. 4(c), conductor films made of Pd and Au are sequentially deposited to have a total thickness of 50 nm or less by a vacuum evaporation technique or the like over the entire surface of the first contact layer 22 as well as over the pad electrode 42A, thereby forming the p-side ohmic electrode 24. And on the other surface of the substrate 11 opposite to the crystal-growing surface thereof, conductor films made of Ni/AuGe/Au are sequentially deposited, thereby forming the n-side ohmic electrode 25.

Then, the substrate 11, on which the pad electrode 42A and the p- and n-side electrodes 24, 25 have been formed, is annealed at a temperature in the range from about 200° C. to about 250° C. As a result, low-resistance ohmic contact is established in the interface between the first contact layer 22 and the p-side ohmic electrode 24 and in the interface between the substrate 11 and the n-side ohmic electrode 25. The second contact layer 41A has been heavily doped with N atoms to have an excessive dopant concentration as high as $5 \times 10^{18}$ cm$^{-3}$ or more. Accordingly, the excessive N dopant atoms are thermally diffused toward the substrate 11, i.e., a part of the superlattice layer 21 and an upper part of the semiconductor layer 20 under the pad electrode 42A. As a result, the high-resistance region 43 shown in FIG. 3 is formed.

It is well known that if N atoms heavily doped at $1 \times 10^{18}$ cm$^{-3}$ or more are diffused through p-type ZnSe-based compound semiconductors doped with N atoms such as p-type ZnSe or ZnSSe, then the N atoms increase the resistance of these compound semiconductors.

Hereinafter, the operation of the light-emitting diode device having the above-described structure will be described.

The n-side ohmic electrode 25 is grounded and a predetermined operating voltage is applied to the p-side ohmic electrode 24 such that the device is forward biased. Then, holes and electrons are injected into the quantum well active layer 17 from the p-type semiconductor layers and the n-type semiconductor layers, respectively. As a result, the energy generated during the recombination of these carriers is emitted as light from the quantum well active layer 17.

In this embodiment, since the p-side ohmic electrode 24 has such a thickness as to transmit the emitted light, the emitted light can be taken out of the device through a region of the p-side ohmic electrode 24 surrounding the pad electrode 42A.

Moreover, the high-resistance region 43, formed as a result of the diffusion of N atoms through ZnSe-based semiconductor layers, is provided between the pad electrode 42A and the quantum well active layer 17. Accordingly, no hole current flows between the pad electrode 42A and the quantum well active layer 17. Thus, substantially no hole current is injected into a region of the quantum well active layer 17 under the pad electrode 42A. As a result, the light emission is suppressed in this region. Since no hole current flows in vain to be absorbed into the pad electrode 42A, the external quantum efficiency can be increased.

As described above, in this device, the high-resistance region 43 is formed to be self-aligned between the pad electrode 42A and the quantum well active layer 17. As a result, an external quantum efficiency of 10% or more can be attained easily and with more certainty at a wavelength of about 500 nm without performing the same crystal-growing process step several times.

If a reflective layer having a DBR structure is further provided between the second buffer layer 13 and the first cladding layer 15 as in the first embodiment, the external quantum efficiency can be even more increased.

Embodiment 3

Hereinafter, the third embodiment of the present invention will be described with reference to FIG. 5.

Figure 5:
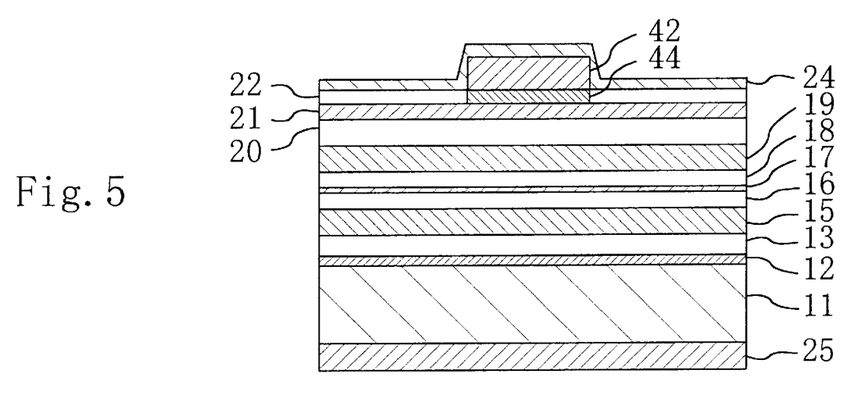
FIG. 5 is a cross-sectional view illustrating the structure of a ZnSe-based light-emitting diode device in the third embodiment of the present invention.

FIG. 5 illustrates the cross-sectional structure of a ZnSe-based light-emitting diode device of the third embodiment. As shown in FIG. 5, a first buffer layer 12, made of n-type GaAs, for buffering lattice mismatching with a substrate 11 made of n-type GaAs is formed on the substrate 11. On the first buffer layer 12, a second buffer layer 13, made of n-type ZnSe, for buffering lattice mismatching between GaAs crystals and ZnSe crystals, is formed. On the second buffer layer 13, a first cladding layer 15, made of n-type ZnMgSSe, for forming a potential barrier for an active layer (to be described below) and thereby efficiently injecting n-type carriers into the active layer, is formed. On the first cladding layer 15, a first spacer layer 16, made of non-doped ZnSSe, for improving the crystal quality of the active layer and efficiently injecting the n-type carriers into the active layer, is formed. On the first spacer layer 16, a quantum well active layer 17, made of $Zn_{1-x}Cd_xSe$, for emitting light by the recombination of the injected n-type and p-type minority carriers, is formed. On the quantum well active layer 17, a second spacer layer 18, made of non-doped ZnSSe, for efficiently injecting p-type carriers into the active layer, is formed. On the second spacer layer 18, a second cladding layer 19, made of p-type ZnMgSSe, for forming a potential barrier for the active layer 17 and thereby efficiently injecting p-type carriers into the active layer 17, is formed. On the second cladding layer 19, a semiconductor layer 20, made of p-type ZnSSe, for connecting stepwise the energy level on the valence band between the second cladding layer 19 and a contact layer (to be described below) is formed. On the semiconductor layer 20, a superlattice layer 21, including alternately stacked p-type ZnSe layers and p-type ZnTe layers and connecting stepwise the energy level on the valence band between the semiconductor layer 20 and the contact layer, is formed. And on the superlattice layer 21, a contact layer 22, which is made of p-type ZnTe and makes ohmic contact with an electrode, is formed.

On the upper surface of the contact layer 22, a pad electrode 42, which is made of Au (enabling ohmic contact with the contact layer 22) and has a thickness of several hundreds nanometers, is formed in the shape of a dot to be a bonding pad. A p-side ohmic electrode 24, which is made of Pd and Au and has such a thickness as to transmit the emitted light (e.g., 50 nm or less), is formed over the entire surface of the contact layer 22, as well as over the pad electrode 42. On the other surface of the substrate 11 opposite to the crystal-growing surface thereof, an n-side ohmic electrode 25 made of Ni/AuGe/Au is formed.

This embodiment is characterized in that an insulating oxide film 44, made of ZnO, is further formed as a current blocking layer in a region of the contact layer 22 under the pad electrode 42.

Hereinafter, a method for fabricating the light-emitting diode device (the insulating oxide film 44, in particular) of this embodiment will be described.

First, the respective layers from the first buffer layer 12 through the contact layer 22 are sequentially crystal-grown on the substrate 11 in accordance with an MBE technique, for example. Thereafter, a bonding pad forming region of the contact layer 22 is exposed to plasma for about 10 minutes on the conditions that the partial pressure of $O_2$ is 20 mTorr and the RF power is 100 W, for example. As a result, the insulating oxide film 44 made of ZnO is formed to be about 100 nm thick in the bonding pad forming region of the contact layer 22. ZnO is a Group II–VI compound and is highly stable.

Then, a conductor film made of Au is deposited over the entire surface of the contact layer 22 in accordance with a vacuum evaporation technique, for example. And, with a bonding pad forming region of the conductor film masked, the conductor film is etched until the contact layer 22 is exposed. In this manner, the pad electrode 42 is formed in the shape of a dot. Subsequently, conductor films made of Pd and Au are sequentially deposited to have a total thickness of 50 nm or less by a vacuum evaporation technique or the like over the entire surface of the contact layer 22 as well as over the pad electrode 42. The p-side ohmic electrode 24 is formed in this manner. And on the other surface of the substrate 11 opposite to the crystal-growing surface thereof, conductor films made of Ni/AuGe/Au are sequentially deposited, thereby forming the n-side ohmic electrode 25.

Then, the substrate 11, on which the pad electrode 42 and the p- and n-side electrodes 24, 25 have been formed, is annealed at a temperature in the range from about 200° C. to about 250° C. As a result, low-resistance ohmic contact is established in the interface between the contact layer 22 and the p-side ohmic electrode 24 and the pad electrode 42 and in the interface between the substrate 11 and the n-side ohmic electrode 25.

Hereinafter, the operation of the light-emitting diode device having the above-described structure will be described.

The n-side ohmic electrode 25 is grounded and a predetermined operating voltage is applied to the p-side ohmic electrode 24 such that the device is forward biased. Then, holes and electrons are injected into the quantum well active layer 17 from the p-type semiconductor layers and the n-type semiconductor layers, respectively. As a result, the energy generated during the recombination of these carriers is emitted as light from the quantum well active layer 17.

In this embodiment, since the p-side ohmic electrode 24 has such a thickness as to transmit the emitted light, the emitted light can be taken out of the device through a region of the p-side ohmic electrode 24 surrounding the pad electrode 42.

Moreover, the insulating oxide film 44, formed as a result of the plasma oxidation of Zn contained in the contact layer 22, is provided between the pad electrode 42 and the quantum well active layer 17. Accordingly, no hole current flows between the pad electrode 42 and the quantum well active layer 17. Thus, substantially no hole current is injected into a region of the quantum well active layer 17 under the pad electrode 42. As a result, the light emission is suppressed in this region. Since no hole current flows in vain to be absorbed into the pad electrode 42, the external quantum efficiency can be increased.

In addition, since plasma oxidation is employed in this embodiment, the insulating oxide film 44 can be formed at a relatively low temperature and the quantum well active layer 17 is not thermally damaged.

As described above, in this device, the insulating oxide film 44 is formed between the pad electrode 42 and the quantum well active layer 17. As a result, an external quantum efficiency of 10% or more can be attained easily at a wavelength of about 500 nm without performing the same crystal-growing process step several times.

If a reflective layer having a DBR structure is further provided between the second buffer layer 13 and the first cladding layer 15 as in the first embodiment, the external quantum efficiency can be even more increased.

In this embodiment, the layers, which are located under the quantum well active layer 17 and are closer to the substrate 11, are n-type. On the other hand, the layers, which are located over the quantum well active layer 17 and are closer to the pad electrode 42, are p-type. This arrangement is employed to increase the blocking effect attained by the current blocking layer, i.e., insulating oxide film 44. This is because if the insulating oxide film 44 is provided in the p-type layers having a lower resistivity than that of the n-type layers, the operating current is less likely to diffuse horizontally to the surface of the substrate.

However, since the requirement for a light-emitting diode device is less strict than that for a semiconductor laser device, substantially the same effects can be attained if the conductivity types of these two groups of layers are interchanged.

Modified Example of Embodiment 3

Hereinafter, a modified example of the third embodiment will be described with reference to FIG. 6.

Figure 6:
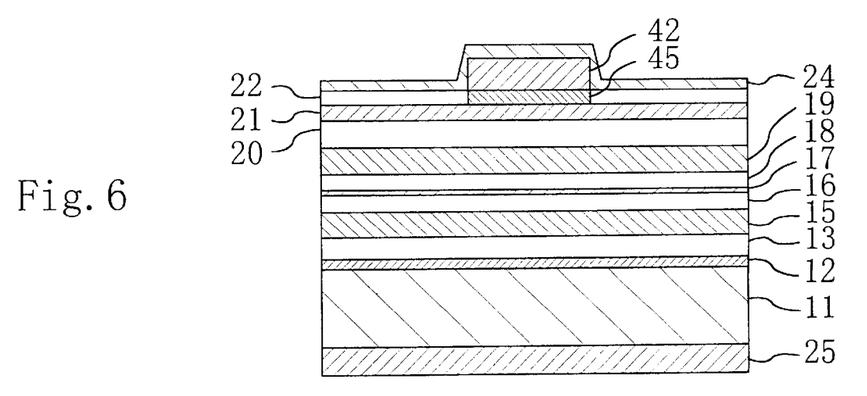
FIG. 6 is a cross-sectional view illustrating the structure of a ZnSe-based light-emitting diode device in a modified example of the third embodiment.

FIG. 6 illustrates the cross-sectional structure of a ZnSe-based light-emitting diode device as a modified example of the third embodiment. In FIG. 6, the same components as those shown in FIG. 5 are identified by the same reference numerals and the description thereof will be omitted herein. In the third embodiment, the insulating oxide film 44 is formed as a current blocking layer between the pad electrode 42 and the quantum well active layer 17 in accordance with a plasma oxidation technique using $O_2$ plasma. In this modified example, the bonding pad forming region of the contact layer 22 is exposed to plasma produced from Ar gas as an inert gas, thereby forming a crystal defect introduced layer 45 as a current blocking layer between the pad electrode 42 and the quantum well active layer 17.

In the crystal defect introduced layer 45, a large number of holes have been eliminated by Ar atoms in the state of plasma and the concentration of holes has decreased to $1\times10^{16}$ cm$^{-3}$ or less. Accordingly, it is possible to prevent hole current from being injected into a region of the quantum well active layer 17 under the pad electrode 42. Since the crystal defect introduced layer 45 is provided between the pad electrode 42 and the quantum well active layer 17 in this device, an external quantum efficiency of 10% or more can be attained easily at a wavelength of about 500 nm without performing the same crystal-growing process step several times.

If a reflective layer having a DBR structure is further provided between the second buffer layer 13 and the first cladding layer 15 as in the first embodiment, the external quantum efficiency can be even more increased.

In this modified example, the layers closer to the substrate 11 are n-type and those closer to the pad electrode 42 are p-type. Alternatively, the conductivity types of these two groups of layers may be interchanged as described above.

Embodiment 4

Hereinafter, the fourth embodiment of the present invention will be described with reference to FIG. 7.

Figure 7:
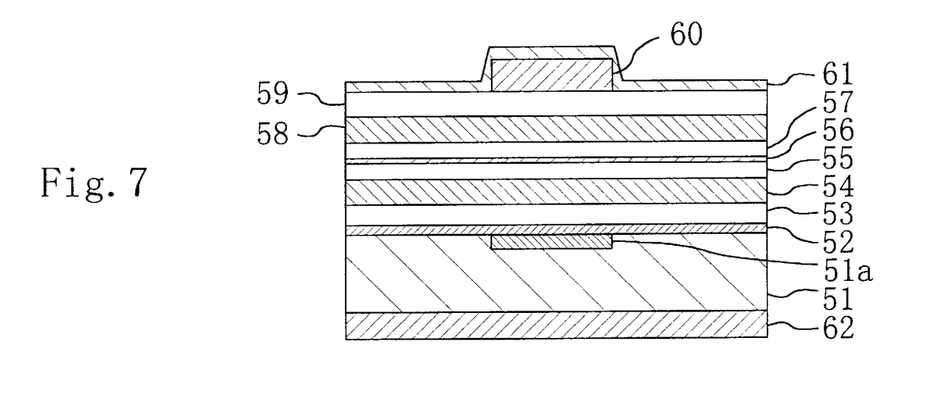
FIG. 7 is a cross-sectional view illustrating the structure of a ZnSe-based light-emitting diode device in the fourth embodiment of the present invention.

FIG. 7 illustrates the cross-sectional structure of a ZnSe-based light-emitting diode device of the fourth embodiment. As shown in FIG. 7, a high-resistance region 51a is formed in a bonding pad forming region on the upper surface of a p-type GaAs substrate 51 by implanting $H^+$ ions (protons), for example.

On the substrate 51 in which the high-resistance region 51a is formed, a first buffer layer 52, made of p-type GaAs, for buffering lattice mismatching with the substrate 51 is formed. On the first buffer layer 52, a second buffer layer 53, made of p-type ZnSe, for buffering lattice mismatching between GaAs crystals and ZnSe crystals, is formed. On the second buffer layer 53, a first cladding layer 54, made of pype ZnMgSSe, for forming a potential barrier for an active layer (to be described below) and thereby efficiently injecting p-type carriers into the active layer, is formed. On the first cladding layer 54, a first spacer layer 55, made of non-doped ZnSSe, for improving the crystal quality of the active layer and thereby efficiently injecting the p-type carriers into the active layer, is formed. On the first spacer layer 55, a quantum well active layer 56, made of $Zn_{1-x}Cd_xSe$, for emitting light by the recombination of the injected n-type and p-type minority carriers, is formed. On the quantum well active layer 56, a second spacer layer 57, made of non-doped ZnSSe, for efficiently injecting n-type carriers into the active layer, is formed. On the second spacer layer 57, a second cladding layer 58, made of n-type ZnMgSSe, for forming a potential barrier for the active layer 56 and thereby efficiently injecting n-type carriers into the active layer 56, is formed. And on the second cladding layer 58, a contact layer 59, which is made of n-type ZnTe and makes ohmic contact with an electrode, is formed. These layers are formed by an MBE technique, for example.

On the upper surface of the contact layer 59, a pad electrode 60, which is made of Au (enabling ohmic contact with the contact layer 59) and has a thickness of several hundreds nanometers, is formed in the shape of a dot to be a bonding pad. An n-side ohmic electrode 61, which is made of Ti and Au and has such a thickness as to transmit the emitted light (e.g., 50 nm or less), is formed over the entire surface of the contact layer 59, as well as over the pad electrode 60. On the other surface of the substrate 51 opposite to the crystal-growing surface thereof, a p-side ohmic electrode 62 made of AuZn/Au is formed.

Hereinafter, the operation of the light-emitting diode device having the above-described structure will be described.

The n-side ohmic electrode 61 is grounded and a predetermined operating voltage is applied to the p-side ohmic electrode 62 such that the device is forward biased. Then, holes and electrons are injected into the quantum well active layer 56 from the p-type semiconductor layers and the n-type semiconductor layers, respectively. As a result, the energy generated during the recombination of these carriers is emitted as light from the quantum well active layer 56.

In this embodiment, since the n-side ohmic electrode 61 has such a thickness as to transmit the emitted light, the emitted light can be taken out of the device through a region of the n-side ohmic electrode 61 surrounding the pad electrode 60.

Moreover, the high-resistance region 51a, formed by implanting protons thereto, is provided in an upper part of the substrate 51 under the pad electrode 60. Accordingly, no hole current flows through a region of the quantum well active layer 56 over the high-resistance region 51a. Thus, substantially no hole current is injected into a region of the quantum well active layer 56 under the pad electrode 60. As a result, the light emission is suppressed in this region. Since no hole current flows in vain to be absorbed into the pad electrode 60, the external quantum efficiency can be increased.

As described above, in this device, the high-resistance region 51a is formed under the quantum well active layer 56. As a result, an external quantum efficiency of 10% or more can be attained easily and with more certainty at a wavelength of about 500 nm without performing the same crystal-growing process step several times.

The ions for forming the high-resistance region 51a in the substrate 51 are $H^+$ ions in this embodiment. Alternatively, $B^+$ ions or $O^{2-}$ ions may also be used.

If a reflective layer having a DBR structure is further provided between the second buffer layer 53 and the first cladding layer 54 as in the first embodiment, the external quantum efficiency can be even more increased.

In this embodiment, the layers closer to the substrate 51, in which the high-resistance region 51a is formed as a current blocking layer, are p-type and those closer to the pad electrode 60 are n-type. Alternatively, the conductivity types of these two groups of layers may be interchanged as described above.

In a GaN-based light-emitting diode device using Group III–V, if the substrate is made of SiC, then a similar high-resistance region to that of this embodiment can be formed as a current blocking layer.

What is claimed is:

1. A light-emitting diode device comprising:
   an active layer formed over an n-type semiconductor substrate;
   a p-type contact layer formed over the active layer;
   a Schottky electrode, selectively formed on the contact layer, for making Schottky contact with the contact layer, the Schottky electrode being used as a bonding pad; and
   an ohmic electrode, formed to surround the Schottky electrode on the contact layer and to be electrically connected to the Schottky electrode, for transmitting light emitted from the active layer.

2. The device of claim 1, wherein the level of a Schottky barrier between the Schottky electrode and the contact layer is 0.3 eV or more.

3. The device of claim 1, wherein the Schottky electrode is made of a conductor selected from a group including aluminum, zinc and thallium.

4. The device of claim 1, further comprising a reflective layer, which is formed between the semiconductor substrate and the active layer and has a distributed Bragg-reflector structure.

5. A light-emitting diode device comprising:

an active layer formed over a semiconductor substrate of a first conductivity type;

a contact layer of a second conductivity type formed over the active layer;

a pad electrode selectively formed on the contact layer and used as a bonding pad;

an ohmic electrode, formed to surround the pad electrode on the contact layer and to be electrically connected to the pad electrode, for transmitting light emitted from the active layer; and a high-resistance region formed under the pad electrode.

6. The device of claim 5, wherein the first conductivity type is n-type and the second conductivity type is p-type, and wherein the high-resistance region is made of a p-type semiconductor layer, which is formed between the active layer and the contact layer, is doped with nitrogen atoms at $1.0 \times 10^{18}$ cm$^{-3}$ or more and contains zinc and selenium.

7. The device of claim 5, wherein the high-resistance region is made of an insulating oxide film formed over the active layer.

8. The device of claim 7, wherein the insulating oxide film is made of zinc oxide.

9. The device of claim 5, wherein the high-resistance region is made of a crystal defect introduced layer formed over the active layer.

10. The device of claim 5, wherein the high-resistance region is formed in the semiconductor substrate.

11. The device of claim 5, further comprising a reflective layer, which is formed between the semiconductor substrate and the active layer and has a distributed Bragg-reflector structure.

12. A light-emitting diode device comprising:

a reflective layer, which is formed over a semiconductor substrate of a first conductivity type and has a distributed Bragg-reflector structure;

an active layer formed over the reflective layer;

a contact layer of a second conductivity type formed over the active layer;

a pad electrode selectively formed on the contact layer and used as a bonding pad; and an ohmic electrode, formed to surround the pad electrode on the contact layer and to be electrically connected to the pad electrode, for transmitting light emitted from the active layer.

* * * * *